United States Patent
Hansen et al.

(10) Patent No.: US 7,197,487 B2
(45) Date of Patent: Mar. 27, 2007

(54) APPARATUS AND METHOD FOR ESTIMATING BATTERY STATE OF CHARGE

(75) Inventors: Terry Hansen, Colorado Springs, CO (US); Chiajiu Wang, Colorado Springs, CO (US)

(73) Assignee: LG Chem, Ltd. (KR)

( * ) Notice: Subject to any disclaimer, the term of this patent is extended or adjusted under 35 U.S.C. 154(b) by 197 days.

(21) Appl. No.: 11/082,090

(22) Filed: Mar. 16, 2005

(65) Prior Publication Data

US 2006/0212277 A1    Sep. 21, 2006

(51) Int. Cl.
   *G06N 5/00*   (2006.01)
(52) U.S. Cl. .................. 706/25; 706/45; 320/131; 320/137; 320/152
(58) Field of Classification Search ............... 706/25, 706/45; 320/131, 137, 152
   See application file for complete search history.

(56) References Cited

U.S. PATENT DOCUMENTS

| | | | | |
|---|---|---|---|---|
| 5,714,866 A | * | 2/1998 | S et al. | 320/152 |
| 5,739,670 A | * | 4/1998 | Brost et al. | 320/131 |
| 5,982,403 A | * | 11/1999 | Inagaki | 347/135 |
| 6,016,047 A | * | 1/2000 | Notten et al. | 320/137 |

OTHER PUBLICATIONS

"Temperature-Dependent Battery Models for High-Power Lithium-Ion Batteries"; Jan. 2001; NREL/CP-540-28716; Authors: Valerie H. Johnson, Ahmad A. Pesaran, Thomas Sack.
"Support vector based battery state of charge estimator"; Journal of Power Sources; Sep. 24, 2004; pp. 6391; 1-8; Authors: Terry Hansen, Chia-Jiu Wang.

* cited by examiner

*Primary Examiner*—Wilbert L. Starks, Jr.
(74) *Attorney, Agent, or Firm*—Cantor Colburn LLP (57) ABSTRACT

A method for training a support vector machine to determine a present state of charge of an electrochemical cell system includes choosing a training data, preprocessing the training data, finding an optimal parameter of the support vector machine, and determining support vectors.

32 Claims, 7 Drawing Sheets

APPARATUS AND METHOD FOR ESTIMATING BATTERY STATE OF CHARGE

BACKGROUND

The present invention relates to a method and apparatus for estimation of battery pack system state of charge. In particular, estimation of battery pack system state of charge using a support vector machine.

In the context of rechargeable battery pack technologies, it is desired in some applications to be able to estimate quantities that are descriptive of the present battery pack condition, but that may not be directly measured. Some of these quantities may change rapidly, such as the pack state-of-charge (SOC), which can traverse its entire range within minutes. Others may change very slowly, such as cell capacity, which might change as little as 20% in a decade or more of regular use. The quantities that tend to change quickly comprise the "state" of the system, and the quantities that tend to change slowly comprise the time varying "parameters" of the system.

In the context of the battery systems, particularly those that need to operate for long periods of time, as aggressively as possible without harming the battery life, for example, in Hybrid Electric Vehicles (HEVs), Battery Electric Vehicles (BEVs), laptop computer batteries, portable tool battery packs, and the like, it is desired that information regarding quickly varying parameters (e.g., SOC) be used to estimate how much battery energy is presently available to do work, and so forth. Further, it may be desirable to ascertain information regarding slowly varying parameters (e.g., total capacity) in order to keep the prior calculations precise over the lifetime of the pack, extending its useful service time, and help in determining the state-of-health (SOH) of the pack.

There are a number of existing methods for estimating the state of a cell, which are generally concerned with estimating three quantities: SOC (a quickly varying quantity), power-fade, and capacity-fade (both slowly time varying). Power-fade may be calculated if the present and initial pack electrical resistances are known, and capacity-fade may be calculated if present and initial pack total capacities are known, for example, although other methods may also be used. Power- and capacity-fade are often lumped under the description "state-of-health" (SOH). Some other information may be derived using the values of these variables, such as the maximum power available from the pack at any given time. Additional state members or parameters may also be needed for specific applications, and individual algorithms would typically be required to find each one.

SOC is a value, typically reported in percent, which indicates the fraction of the cell capacity presently available to do work. A number of different approaches to estimating SOC have been employed: a discharge test, ampere-hour counting (Coulomb counting), measuring the electrolyte, open-circuit voltage measurement, linear and nonlinear circuit modeling, impedance spectroscopy, measurement of internal resistance, coup de fouet, and some forms of Kalman filtering. The discharge test must completely discharge the cell in order to determine SOC. The discharge test interrupts system function while being performed and can be overly time consuming, thus, the discharge test is not useful for many applications. Ampere-hour counting (Coulomb counting) is an "open loop" methodology whose accuracy degrades over time by accumulated measurement error. Measuring the electrolyte is only feasible for vented lead-acid batteries, and therefore has limited applicability. Open-circuit voltage measurement may be performed only after extended periods of cell inactivity, and for cells with negligible hysteresis effect and does not work in a dynamic setting. Linear and nonlinear circuit modeling methods do not yield SOC directly; SOC must be inferred from the calculated values. Impedance spectroscopy requires making measurements not always available in a general application. Measurement of internal resistance is very sensitive to measurement error, and requires measurements not available in general applications. Coup de fouet works for lead-acid batteries only. Forms of Kalman filtering that do not use SOC as a filter state do not directly yield error bounds on the estimate. However, Kalman filtering typically involves a high computational complexity. Thus, Kalman filtering requires a 32-bit processor, which increases implementation cost.

There is a need for a cheaper alternative to Kalman filtering, which can produce an accurate estimation of SOC at a cheaper cost. Furthermore, there is a need for a method, which cheaply and accurately estimates SOC without requiring invasive measurements, interrupting system function, or wasting energy.

SUMMARY OF THE INVENTION

Disclosed herein in one or more exemplary embodiments are methods and apparatus for estimating the state of charge of an electrochemical cell. More particularly, for example, estimating state of charge values of a battery.

Exemplary embodiments of the invention include a method for training a support vector machine to determine a present state of charge of an electrochemical cell system. The method includes choosing a training data, preprocessing the training data, finding an optimal parameter of the support vector machine, and determining support vectors.

Further exemplary embodiments of the invention include a method for estimating a present state of charge of an electrochemical cell using a trained support vector machine. The method includes preprocessing test data and testing an optimized support vector machine using the test data.

Still further exemplary embodiments of the invention include a method for estimating a present state of charge of an electrochemical cell system. The method includes training a support vector machine for a state of charge estimation, testing the support vector machine, and calculating an estimate of the present state of charge of the electrochemical cell using the support vector machine.

Yet further exemplary embodiments of the invention include an apparatus for estimating a state of charge of an electrochemical cell system. The apparatus includes a sensing component and a trained component. The sensing component is configured to measure a parameter of the electrochemical cell. The trained component is configured to estimate the state of charge of the electrochemical cell. The trained component is in electrical communication with the sensing component. The trained component is a support vector machine.

The above, and other objects, features and advantages of the present invention will become apparent from the following description read in conjunction with the accompanying drawings, in which like reference numerals designate the same elements

BRIEF DESCRIPTION OF THE DRAWINGS

These and other features, aspects and advantages of the present invention will become better understood with regard to the following description, appended claims and accompanying drawing wherein like elements are numbered alike in the several Figures:

DETAILED DESCRIPTION OF THE INVENTION

Disclosed herein in various embodiments, methods and apparatus for the estimation of state of charge of an electrochemical cell using a support vector machine (SVM) are disclosed. Referring now to FIGS. 1–6, in the following description, numerous specific details are set forth in order to provide a more complete understanding of the present invention. It will be appreciated that while the exemplary embodiments are described with reference to a battery cell, numerous electrochemical cells hereinafter referred to as a cell, may be employed, including, but not limited to, batteries, battery packs, ultracapacitors, capacitor banks, fuel cells, electrolysis cells, and the like, as well as combinations including at least one of the foregoing. Furthermore, it will be appreciated that a battery or battery pack may include a plurality of cells, where the exemplary embodiments disclosed herein are applied to one or more cells of the plurality.

The SVM, for example, an 8-bit processor, can be configured to calculate the present state of charge (SOC) of the battery, after the SVM is trained prior to testing. Training the SVM includes condensing thousands of data points into a manageable number of support vectors (SVs). Thus, after training, the SVM can calculate the SOC of the battery in a short time using a less expensive processor than Kalman Filtering. Additionally, the SVM produces a calculation that is comparable in accuracy to that of Kalman Filtering. After training the SVM, the SVM is capable of repeatedly calculating SOC for any battery having a similar range of operation to a training data used to train the SVM. Thus, unless markedly different batteries are to be tested by the SVM, the SVM only requires training once.

Figure 1:
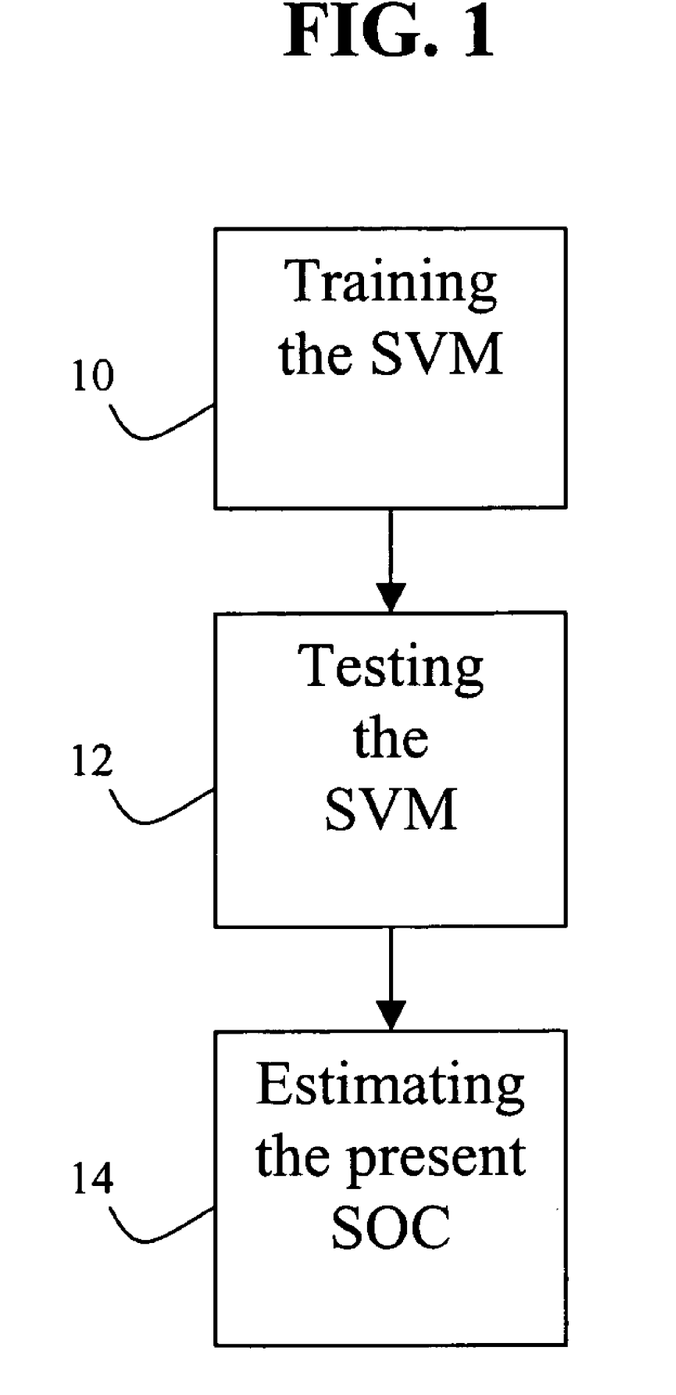
FIG. 1 is a flow chart showing a method for using a support vector machine (SVM) to determine a present state of charge (SOC) of a battery, in accordance with an exemplary embodiment of the invention.

FIG. 1 is a flow chart showing a method for using the SVM to determine a present SOC of the battery. The method includes training the SVM at step 10, testing the optimized SVM at step 12, and estimating the present SOC of the battery at step 14. A detailed description of steps 10, 12 and 14 follows.

Figure 2:
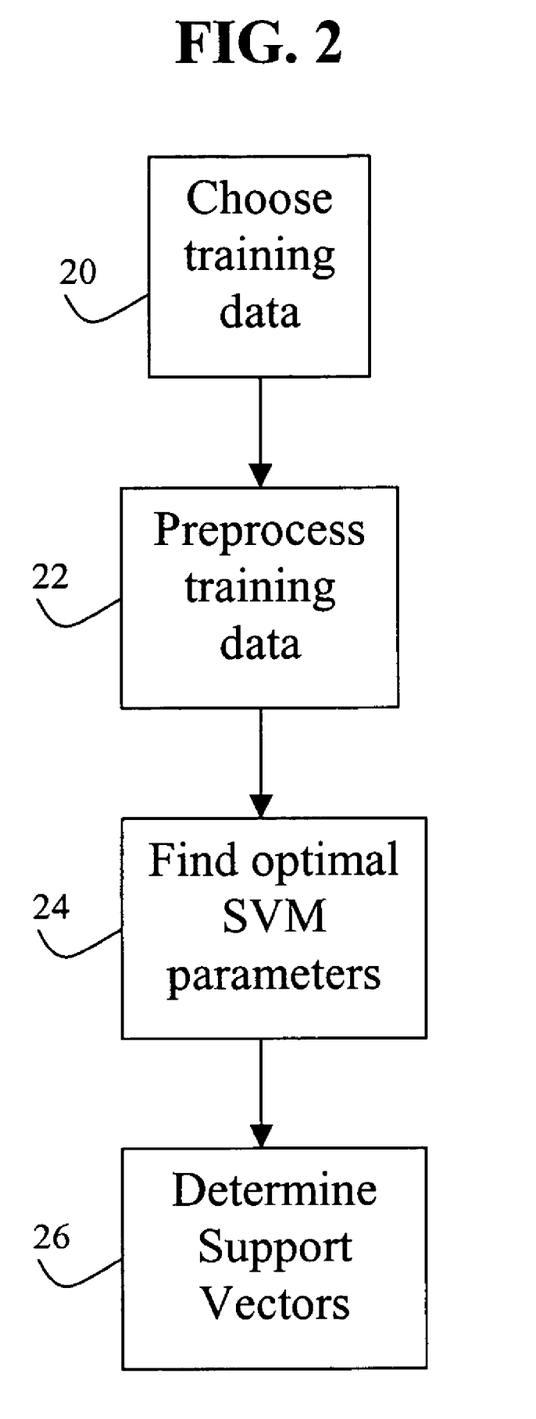
FIG. 2 is a flow chart indicating a process of training the SVM, in accordance with an exemplary embodiment of the invention.

FIG. 2 shows a flow chart indicating in greater detail a process of training the SVM. Training the SVM includes choosing the training data at step 20, preprocessing the training data at step 22, finding optimal parameters of the SVM at step 24, and finding the support vectors at step 26.

Figure 3:
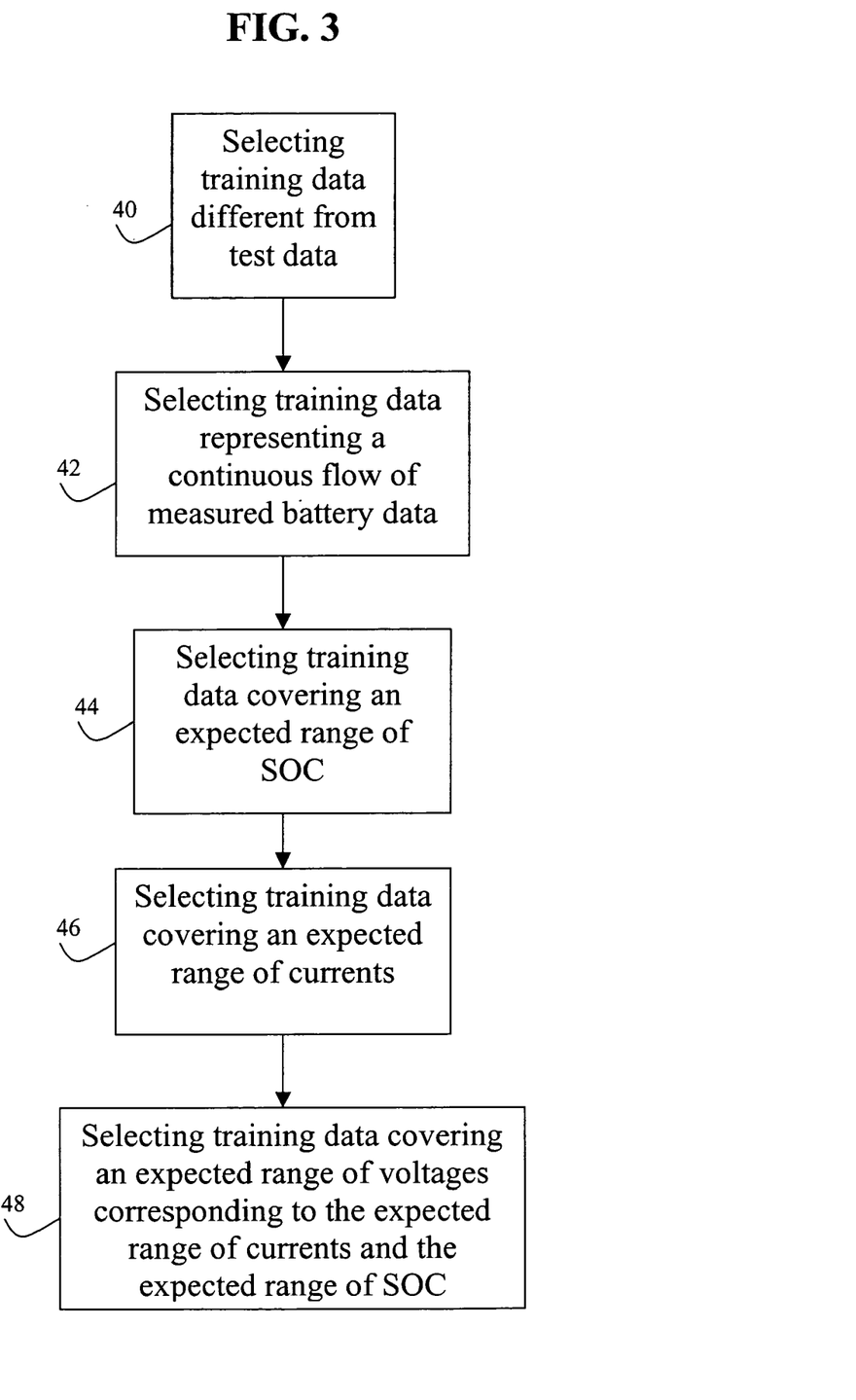
FIG. 3 is a flow chart indicating a process of choosing training data, in accordance with an exemplary embodiment of the invention.

FIG. 3 shows a detailed flow chart for describing the process of choosing training data at step 20 in FIG. 2. Choosing training data includes selecting training data different from test data at step 40, selecting training data that represents a continuous flow of a measured battery data at step 42, selecting training data that covers an expected range of battery SOC at step 44, selecting training data that covers an expected range of battery currents at step 46, and selecting training data that covers an expected range of battery voltages corresponding to the expected range of battery currents and the expected range of battery SOC at step 48.

Choosing training data is important to a proper training of the SVM. Training data should meet certain criteria in order to be selected for training. Training data should be different from test data. Test data is battery data of a battery used to determine the SOC of the battery. Choosing training data that is not different from test data will prevent the SVM from accurately testing the test data. Although training data is selected to be different from the test data at step 40, the training data should be selected to cover an expected range of operation of the battery to be tested at steps 44–48. In an exemplary embodiment, the training data is selected to cover a range of the battery state of charge (SOC) from about 20% SOC to about 80% SOC. The training data is also selected to cover a range of the battery current from about +50 Amps to about −50 Amps. Additionally, the training data is selected to cover a range of battery voltage corresponding to the range of battery currents and the range of battery SOC at step 40. Selecting training data that covers an expected range of operation of the battery to be tested ensures that SVM estimates correlate to the battery to be tested and improve accuracy of SOC calculation. The training data should also represent a continuous flow of a measured battery data to ensure a sufficient number of realistic training points for the SVM.

Figure 4:
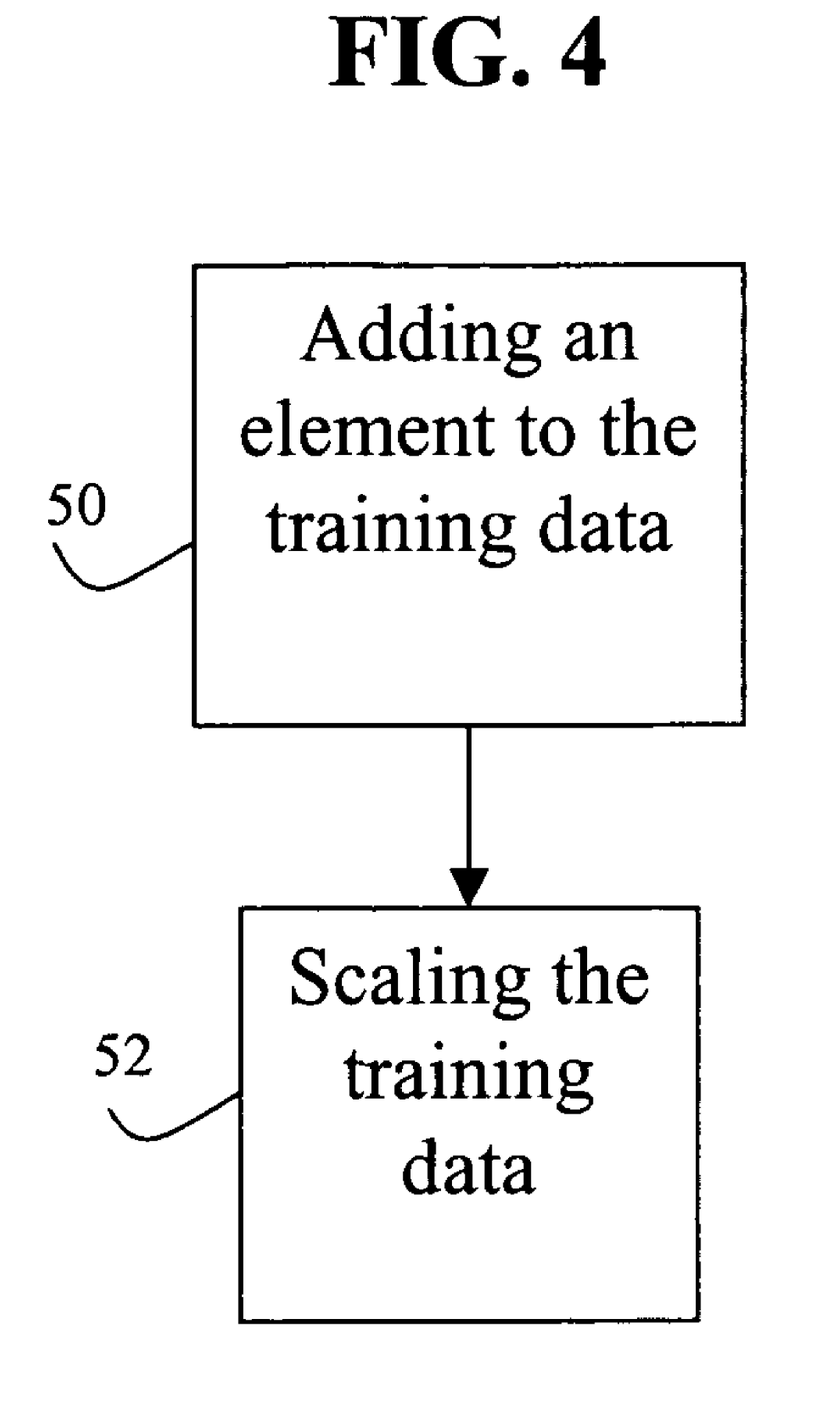
FIG. 4 is a flow chart indicating a process of preprocessing the training data, in accordance with an exemplary embodiment of the invention.

FIG. 4 shows a detailed flow chart for describing the process of preprocessing the training data at step 22 in FIG. 2' Preprocessing the training data includes adding an element to the training data 50 and scaling the training data 52.

After choosing training data at step 20, the training data is preprocessed at step 22 (referring to FIG. 2). In the step of preprocessing training data, the training data is processed to be in a form that can be used to train the SVM. The preprocessing training data step includes adding an element the training data at step 50 to account for a change in the battery voltage during the last one second of a measuring period. Battery voltage may change rapidly during battery operation. Adding an element to account for the change in the battery voltage during the last one second of the measuring period ensures a correction factor to account for rapid changes in battery voltage is included in SOC calculation. After the element is added, the training data undergoes scaling at step 52 to produce scaled training data. To scale the training data, each training datum is scaled to a value between 0.0 and 1.0 so that all input vector elements are in a range between 0.0 and 1.0. Thus, for example, using the exemplary embodiment above referring to FIG. 3, a SOC measurement of 27% would be scaled to 0.27 and a current measurement of −20 would be scaled to 0.37. After scaling, each training datum includes a support vector element corresponding to an instantaneous battery current measurement, an instantaneous battery voltage measurement, a calculated SOC from the previous second, and the change in the battery voltage during the last one second of the measuring period.

Preprocessing of the training data is followed by finding optimal parameters of the SVM at step 24. Finding optimal parameters of the SVM at step 24 includes optimizing a plurality of variables of a training function. Each variable of the plurality of variables represents a single parameter to be optimized. The training function is a function, which the SVM approximates by mathematical calculation. When the training function is approximated under a certain condition, the plurality of variables may be optimized.

In an exemplary embodiment, the training function is $$f(x) = \sum_{i=1}^{N} (\alpha_i - \alpha_i^*) K(x_i, x),$$

where K is a Kernel function $K(a,b)=s\times(a\cdot b)^2+r$. The certain condition is that a loss function is minimized under the constraints:

$$\sum_{i=1}^{N} (\alpha_i - \alpha_i^*) = 0, \quad 0 \le \alpha_i \le C,$$

and $0 \le \alpha_i^* \le C$. The loss function is expressed as:

$$L_\epsilon(y, f(x)) = \begin{cases} |y - f(x)| - \varepsilon & \text{for } |y - f(x)| \ge \varepsilon \\ 0 & \text{otherwise} \end{cases}$$

where $\epsilon$ is a value describing an acceptable tolerance, y is a desired response, and x is an input vector. The loss function is equal to zero if the difference between an estimated f(x) and the desired response y is less than the acceptable tolerance $\epsilon$. Optimal values for C, $\epsilon$, s and r are determined empirically. The loss function is minimized under the constraints above. Support vectors are the training vectors for which either $\alpha_i$ and $\alpha_i^*$ are not zero. When the support vectors are determined at step 26, as described above, the SVM is trained. In an exemplary embodiment, the SVM may be trained using SVMlite [T. Joachims, in: Scholkopf, C. Burges, A. Smola (Eds.), Making Large-Scale SVM Learning Practical. Advances in Kernel Methods-Support Vector Learning, MIT Press, 1999].

Figure 5:
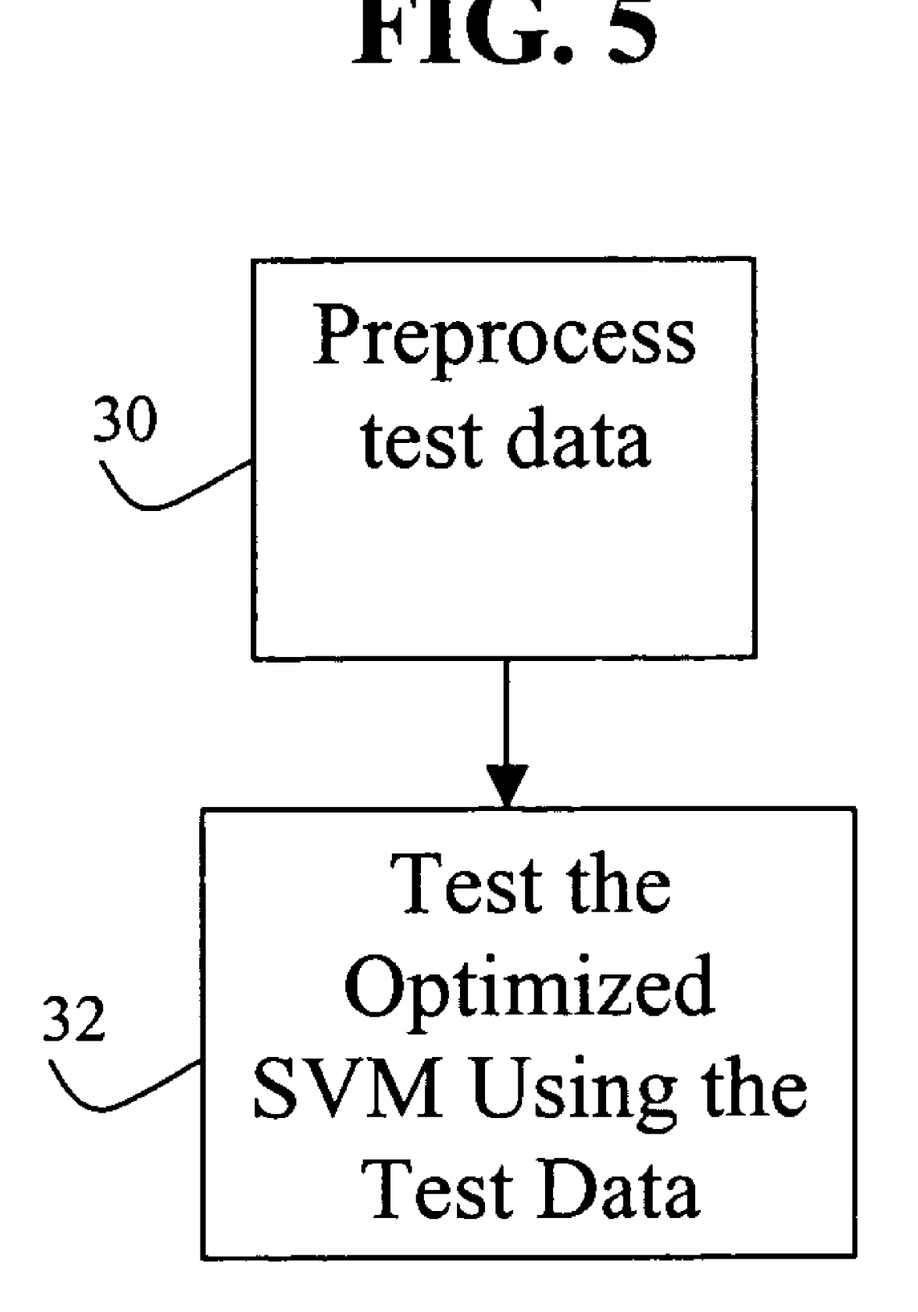
FIG. 5 is a flow chart showing a process of estimating the present SOC of the battery, in accordance with an exemplary embodiment of the invention.
Figure 6:
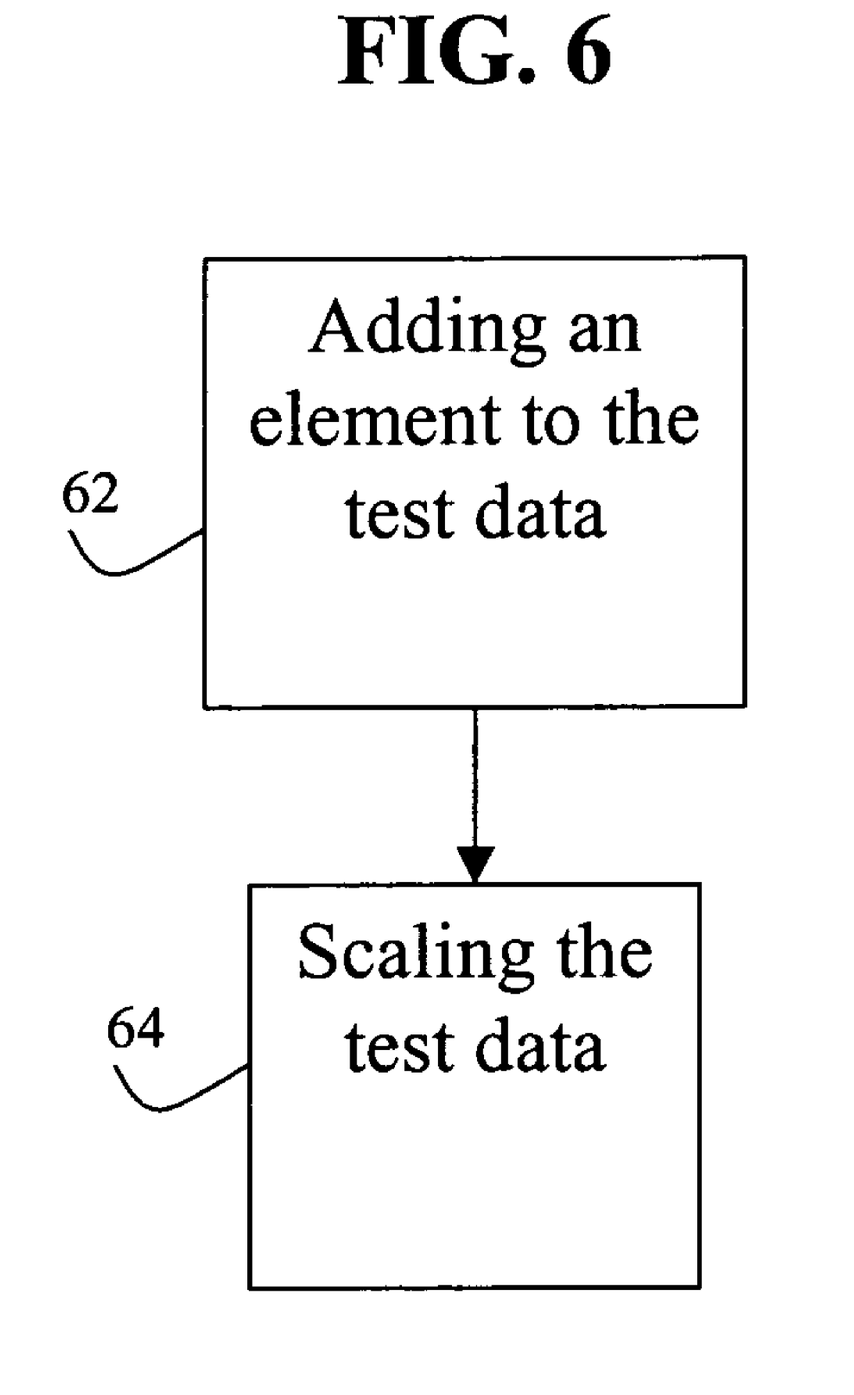
FIG. 6 is a flow chart indicating a process of preprocessing test data, in accordance with an exemplary embodiment of the invention.

Referring back to FIG. 1, upon completion of training the SVM at step 10, the SVM is tested at step 12. Following steps 10 and 12, the SVM is capable of accurately estimating the present SOC of any battery having similar characteristics to the training data. FIG. 5 shows a flow chart indicating in greater detail the process of testing the SVM. Testing the SVM includes preprocessing test data at step 30 and testing the optimized SVM using the test data at step 32. Preprocessing test data at step 30 shown in detail in FIG. 6 and is identical to the process described with respect to FIG. 4, except that test data replaces training data. The SOC element of the input vector is the SOC estimated in the previous second. Referring to FIGS. 5 and 6, preprocessing test data at step 30 includes adding an element to the test data at step 62 to account for the change in the battery voltage during the last one second of the measuring period. After the element is added to the test data, the test data undergoes scaling at step 64 to produce scaled test data. To scale the test data, each test datum is scaled to a value between 0.0 and 1.0 so that all input vector elements are in the range between 0.0 and 1.0. After scaling, each test datum includes a support vector element corresponding to an instantaneous battery current measurement, an instantaneous battery voltage measurement, the calculated SOC from the previous second, and the change in the battery voltage during the last one second of the measuring period.

Scaled test data is used to test the optimized SVM. Support vectors obtained during the training process are loaded into an SVM to create the optimized SVM. The optimized SVM estimates the current battery SOC for a set of preprocessed testing datum. The current battery SOC is compared to a known SOC to calculate an accuracy of the optimized SVM. Several sets of support vectors may be tested to find a set of support vectors that produce a most accurate final optimized SVM. The final optimized SVM may then be used in an apparatus to accomplish real-time estimates of battery SOC.

Figure 7:
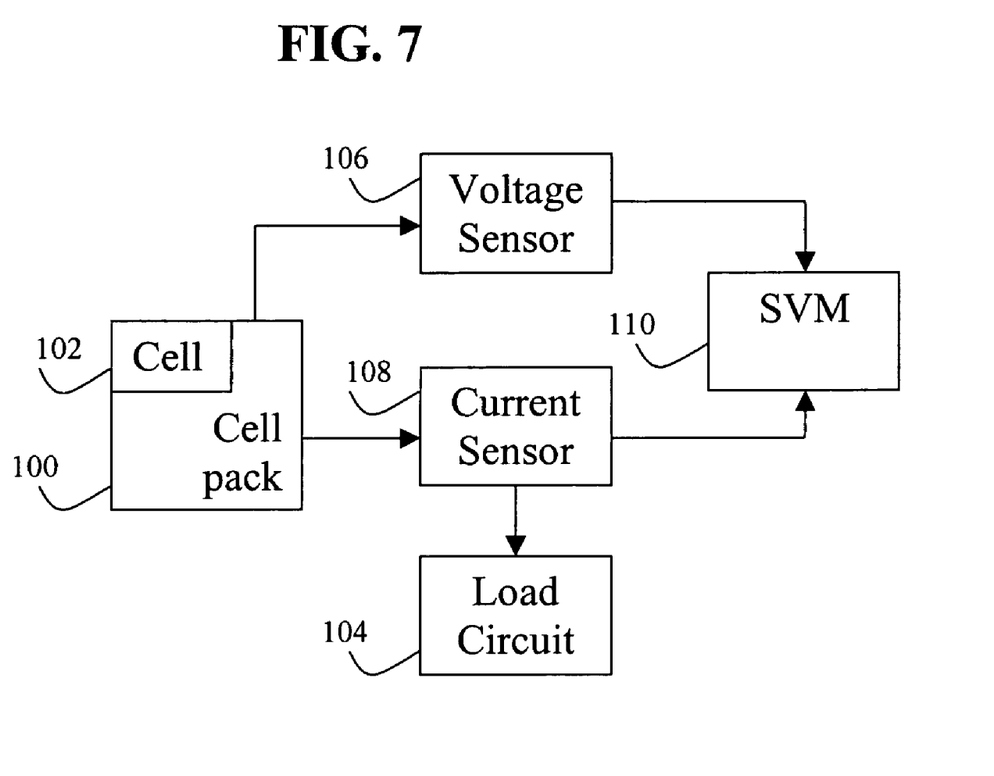
FIG. 7 is a schematic diagram of an apparatus configured to calculate the present SOC of a battery cell using an optimized SVM, in accordance with an exemplary embodiment of the invention.

FIG. 7 shows a schematic diagram of an apparatus configured according to an exemplary embodiment to calculate the present SOC of a battery cell using the optimized SVM described above with reference to FIGS. 1–6. A cell pack 100 is electrically coupled to a load circuit 104. For example, the cell pack 100 may include one or more cells 102, and the load circuit 104 could be a motor in an Electric Vehicle (EV) or a Hybrid Electric Vehicle (HEV). The cell pack 100 is also electrically coupled to a voltage sensor 106, e.g. a voltmeter and the like, and a current sensor 108, e.g., an ammeter and the like. The voltage and current sensors 106 and 108 are electrically coupled to the SVM 110. The SVM is an arithmetic circuit capable of being trained as described above in reference to FIGS. 2–4. An example of the SVM from an exemplary embodiment is an 8-bit processor, although other arithmetic circuits are contemplated.

In order to perform the prescribed functions and desired processing, as well as the computations therefore (e.g., the modeling, estimation of states and parameters prescribed herein, and the like), the SVM 110 may include, but not be limited to, a processor(s), a gate array(s), custom logic, a computer(s), a memory, a storage, a register(s), a timing interrupt(s), communication interfaces, and input/output signal interfaces, as well as combinations comprising at least one of the foregoing.

One or more embodiments of the invention may be implemented as new or updated firmware and software executed in the SVM 110 and/or other processing controllers. Software functions include, but are not limited to, firmware and may be implemented in hardware, software, or a combination thereof. Thus a distinct advantage of the present invention is that it may be implemented for use with existing and/or new processing systems for electrochemical cell charging and control.

The disclosed method may be embodied in the form of computer-implemented processes and apparatuses for practicing those processes. The method can also be embodied in the form of computer program code containing instructions embodied in tangible media, such as floppy diskettes, CD-ROMs, hard drives, or any other computer-readable storage medium, wherein, when the computer program code is loaded into and executed by the computer, the computer becomes an apparatus capable of executing the method. The present method can also be embodied in the form of computer program code, for example, whether stored in a storage medium, loaded into and/or executed by the computer, or as data signal transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus capable of executing the method. When implemented on a general-purpose microprocessor, the computer program code segments configure the microprocessor to create specific logic circuits.

It will be appreciated that the use of first and second or other similar nomenclature for denoting similar items is not intended to specify or imply any particular order unless otherwise stated. Furthermore, the use of the terminology "a" and "at least one of" shall each be associated with the meaning "one or more" unless specifically stated otherwise.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for training a support vector machine to determine a present state of charge of an electrochemical cell system comprising:
   choosing a training data;
   preprocessing the training data;
   finding an optimal parameter of the support vector machine; and
   determining support vectors.

2. The method of claim 1, wherein the choosing a training data comprises:
   obtaining the training data which is different from a test data;
   obtaining the training data which represents a continuous flow of a measured battery data;
   obtaining the training data covering an expected range of a state of charge of the electrochemical cell;
   obtaining the training data covering an expected range of a current of the electrochemical cell; and
   obtaining the training data covering a range of a voltage value of the electrochemical cell corresponding to the expected range of current of the electrochemical cell and the expected range of state of charge of the electrochemical cell.

3. The method of claim 1, wherein the preprocessing the training data comprises:
   adding an element to the training data; and
   scaling the training data.

4. The method of claim 3, wherein the element is a change in a voltage of the electrochemical cell during a last one second of a measuring period.

5. The method of claim 3, wherein the scaling the training data comprises converting each training datum of the training data to a scaled value between 0.0 and 1.0, each the training datum includes a support vector, the support vector includes at least one of:
   an instantaneous current;
   an instantaneous voltage;
   a calculated state of charge from the last one second of the measuring period; and
   the change in a voltage of the electrochemical cell during the last one second of the measuring period.

6. The method of claim 1, wherein the finding the optimal parameter of the support vector machine comprises:
   optimizing a variable of a training function.

7. The method of claim 6, wherein the optimizing the variable further comprises minimizing a loss function under a constraint.

8. The method of claim 7, wherein the variable includes at least one of a first variable $\alpha_i$ and a second variable $\alpha_i^*$, the training function is $$f(x) = \sum_{i=1}^{N} (\alpha_i - \alpha_i^*) K(x_i, x), K$$

is a Kernel function $K(a,b)=s \times (a \cdot b)^2 + r$, a and b are vectors, and x is a support vector.

9. The method of claim 7, wherein the loss function is $$L_\epsilon(y, f(x)) = \begin{cases} |y - f(x)| - \varepsilon & \text{for } |y - f(x)| \geq \varepsilon \\ 0 & \text{otherwise} \end{cases}.$$

10. The method of claim 9, wherein the constraint is at least one of $$\sum_{i=1}^{N} (\alpha_i - \alpha_i^*) = 0, 0 \leq \alpha_i \leq C, \text{ and } 0 \leq \alpha_i^* \leq C.$$

11. A method for estimating a present state of charge of an electrochemical cell using a trained support vector machine, the method comprising:
    preprocessing test data; and
    testing an optimized support vector machine using the test data.

12. The method of claim 11, wherein the preprocessing test data comprises
    adding an element to the test data; and
    scaling the test data, the scaling the test data producing a scaled test data.

13. The method of claim 12, wherein the element is a change in a voltage of the electrochemical cell during a last one second of a measuring period.

14. The method of claim 12, wherein the testing the test data using the trained support vector machine comprises applying the scaled test data to a test function, the test function providing an estimate of the present state of charge of the electrochemical cell.

15. The method of claim 11, wherein the scaling the test data comprises converting a test datum of the test data to a scaled value between 0.0 and 1.0, each the test datum includes a support vector, the support vector includes:
    an instantaneous current;
    an instantaneous voltage; and
    the change in a voltage of the electrochemical cell during the last one second of the measuring period.

16. A method for estimating a present state of charge of an electrochemical cell system comprising:
    training a support vector machine for a state of charge estimation;

testing the support vector machine; and
calculating an estimate of the present state of charge of the electrochemical cell using the support vector machine.

17. The method of claim 16, wherein the training the support vector machine comprises:
choosing a training data;
preprocessing the training data; and
finding an optimal parameter of the support vector machine.

18. The method of claim 17, wherein the choosing a training data comprises:
obtaining the training data which is different from a test data;
obtaining the training data which represents a continuous flow of a measured battery data;
obtaining the training data covering an expected range of a state of charge of the electrochemical cell;
obtaining the training data covering an expected range of a current of the electrochemical cell; and
obtaining the training data covering a range of a voltage value of the electrochemical cell corresponding to the expected range of current and the expected range of state of charge of the electrochemical cell.

19. The method of claim 17, wherein the preprocessing the training data comprises:
adding an element to the training data, the element being a change in a voltage of the electrochemical cell during a last one second of a measuring period; and
scaling the training data.

20. The method of claim 19, wherein the scaling the training data comprises converting a training datum of the training data to a scaled value between 0.0 and 1.0, each of the training datum includes a support vector, the support vector includes:
an instantaneous current;
an instantaneous voltage;
a calculated state of charge from the last one second of the measuring period; and
the change in the voltage of the electrochemical cell during the last one second of the measuring period.

21. The method of claim 17, wherein the finding the optimal parameter of the support vector machine comprises:
optimizing a variable of a training function.

22. The method of claim 21, wherein the optimizing the variable comprises minimizing a loss function under a constraint.

23. The method of claim 16, wherein the testing the support vector machine comprises:
preprocessing test data; and
testing the support vector machine using the test data.

24. The method of claim 23, wherein the preprocessing test data comprises:
adding an element to the test data, the element being a change in a voltage of the electrochemical cell during a last one second of a measuring period; and
scaling the test data, the scaling the test data producing a scaled test data.

25. The method of claim 24, wherein the scaling the test data comprises converting a test datum of the test data to a scaled value between 0.0 and 1.0, each the test datum includes a support vector corresponding to a specific time, the support vector includes at least one of:
an instantaneous current;
an instantaneous voltage; and
the change in the voltage of the electrochemical cell during the last one second of the measuring period.

26. The method of claim 24, wherein the testing the test data comprises applying the scaled test data to a test function, the test function providing the estimate of the present state of charge of the electrochemical cell.

27. An apparatus for estimating the state of charge of an electrochemical cell, the apparatus comprising:
a sensing component configured to measure a parameter of the electrochemical cell; and
a trained component configured to estimate the state of charge of the electrochemical cell, wherein the trained component is in electrical communication with the sensing component, and the trained component is a support vector machine.

28. The apparatus of claim 27, wherein the sensing component configured to measure the parameter of the electrochemical cell comprises at least one of:
a voltage sensor to measure a voltage of the electrochemical cell; and
a current sensor to measure a current of the electrochemical cell.

29. The apparatus of claim 28, wherein the trained component comprises an arithmetic circuit configured to receive an instruction, the instruction enabling the trained component to find an optimal variable of a first function when a second function is minimized under a constraint.

30. The apparatus of claim 29, wherein the trained component further comprises the arithmetic circuit configured to estimate the state of charge of the electrochemical cell via a third function.

31. The apparatus of claim 29, wherein the first function is $$f(x) = \sum_{i=1}^{N} (\alpha_i - \alpha_i^*) K(x_i, x),$$

wherein K is a Kernel function $K(a,b) = s \times (a \cdot b)^2 + r$, a and b are vectors, x is a support vector, and the optimal variable is at least one of $\alpha_i$ and $\alpha_i^*$.

32. The apparatus of claim 29, wherein the second function is $$L_\epsilon(y, f(x)) = \begin{cases} |y - f(x)| - \varepsilon & \text{for } |y - f(x)| \geq \varepsilon \\ 0 & \text{otherwise} \end{cases}$$

and the constraint is at least one of $$\sum_{i=1}^{N} (\alpha_i - \alpha_i^*) = 0, \ 0 \leq \alpha_i \leq C, \text{ and } 0 \leq \alpha_i^* \leq C.$$

* * * * *